United States Patent
Kim et al.

(10) Patent No.: US 11,223,022 B2
(45) Date of Patent: Jan. 11, 2022

(54) LIGHT EMITTING DEVICE AND TRANSPARENT DISPLAY DEVICE USING THE SAME

(71) Applicant: LG Display Co., Ltd., Seoul (KR)

(72) Inventors: Jae-Hyeon Kim, Paju-si (KR); Eun-Jung Park, Goyang-si (KR); Seok-Hyun Kim, Seoul (KR); Kwan-Soo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/549,897

(22) Filed: Aug. 23, 2019

(65) Prior Publication Data

US 2020/0075883 A1 Mar. 5, 2020

(30) Foreign Application Priority Data

Aug. 31, 2018 (KR) .................. 10-2018-0103974

(51) Int. Cl.
*H01L 51/52* (2006.01)
*H01L 51/50* (2006.01)
*H01L 51/00* (2006.01)

(52) U.S. Cl.
CPC ...... *H01L 51/5221* (2013.01); *H01L 51/5072* (2013.01); *H01L 51/5092* (2013.01); *H01L 51/0067* (2013.01); *H01L 51/0072* (2013.01); *H01L 51/0077* (2013.01); *H01L 2251/558* (2013.01)

(58) Field of Classification Search
None
See application file for complete search history.

(56) References Cited

U.S. PATENT DOCUMENTS

| 8,587,499 B2 | 11/2013 | Kang et al. | |
| 9,331,308 B2* | 5/2016 | Choi | H01L 51/0077 |
| 9,905,802 B2* | 2/2018 | Choi | H01L 51/5228 |
| 2008/0164809 A1* | 7/2008 | Matsunami | H01L 51/008 313/504 |
| 2009/0039769 A1* | 2/2009 | Matsunami | H01L 51/5048 313/504 |
| 2011/0012816 A1 | 1/2011 | Kang et al. | |
| 2011/0180792 A1 | 7/2011 | Lee et al. | |
| 2014/0353611 A1* | 12/2014 | Choi | H01L 51/0061 257/40 |

(Continued)

FOREIGN PATENT DOCUMENTS

| CN | 101652864 A | 2/2010 |
| CN | 104218051 A | 12/2014 |

(Continued)

OTHER PUBLICATIONS

European Patent Office, Extended European Search Report and Opinion, EP Patent Application No. 19194763.9, dated Jan. 20, 2020, seven pages.

(Continued)

*Primary Examiner* — Telly D Green
(74) *Attorney, Agent, or Firm* — Fenwick & West LLP

(57) ABSTRACT

Disclosed are a light emitting device which has improved reliability by increasing bonding force between a cathode and organic layers contacting both surfaces thereof, and a transparent display device using the same.

13 Claims, 15 Drawing Sheets

(56) References Cited

U.S. PATENT DOCUMENTS

| | | | |
|---|---|---|---|
| 2015/0076456 A1* | 3/2015 | Choi | ................... H01L 27/3267 257/40 |
| 2015/0079710 A1* | 3/2015 | Kim | ....................... H01L 51/56 438/29 |
| 2016/0218321 A1* | 7/2016 | Choi | ................... H01L 51/0072 |
| 2016/0225832 A1* | 8/2016 | Kwon | ................. H01L 51/5218 |
| 2017/0250234 A1 | 8/2017 | He et al. | |
| 2019/0103560 A1* | 4/2019 | Jung | ................... H01L 51/0071 |
| 2019/0189932 A1 | 6/2019 | Sekine et al. | |

FOREIGN PATENT DOCUMENTS

| | | |
|---|---|---|
| CN | 106449714 A | 2/2017 |
| EP | 2 530 717 A2 | 12/2012 |
| JP | 2011-023340 A | 2/2011 |
| JP | 2013-004245 A | 1/2013 |
| WO | WO 2018/037880 A1 | 3/2018 |
| WO | WO 2018/124750 A1 | 7/2018 |

OTHER PUBLICATIONS

Japan Patent Office, Notice of Reason for Refusal, JP Patent Application No. 2019-155215, dated Aug. 25, 2020, six pages.
China National Intellectual Property Administration, Office Action, CN Patent Application No. 201910814708.3, dated Oct. 9, 2021, 19 pages.

* cited by examiner

FIG. 14F

| |
|---|
| 262 (C1+Liq) |
| 250 or 251 |
| 242 (C1+Liq) |

FIG. 14G

| |
|---|
| 263 (C1+Liq+transition metal) |
| 250 or 251 |
| 244 (C1+Liq+transition metal) |

FIG. 14H

| |
|---|
| 264 (C1+transition metal) |
| 250 or 251 |
| 244 (C1+Liq+transition metal) |

LIGHT EMITTING DEVICE AND TRANSPARENT DISPLAY DEVICE USING THE SAME

CROSS-REFERENCE TO RELATED APPLICATION

This application claims the benefit of Republic of Korea Patent Application No. 10-2018-0103974, filed on Aug. 31, 2018, which is hereby incorporated by reference in its entirety.

BACKGROUND

Field of the Technology

The present disclosure relates to a light emitting device, and more particularly, to a light emitting device in which organic layers contacting both surfaces of a cathode include an organic compound with lone-pair electrons to increase bonding force at the interfaces between the cathode and the organic layers and thus to have improved reliability, and a transparent display device using the same.

Discussion of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD) device, a plasma display panel (PDP) device, a field emission display (FED) device, an organic light emitting diode (OLED) display device, a quantum dot display device, etc.

Thereamong, self-luminous display devices which do not require separate light sources and achieve compactness and clear color display, such as an organic light emitting diode display device and a quantum dot display device, are considered as competitive applications.

A self-luminous display device includes a plurality of subpixels arranged on a substrate, and each subpixel includes a light emitting diode having an anode and a cathode disposed opposite to each other and a light emitting layer provided between the anode and the cathode.

Since the self-luminous display device displays an image using light emitted by the light emitting diodes, it is important to effectively use an amount extracted of light from the light emitting diodes. Therefore, in order to raise light transmissivity, an effort to reduce the thickness of the cathode located in a light emitting direction and to increase reliability of the cathode and element adjacent thereto so as to stabilize performance of the display device has been made.

In a top emission structure which is used now, an anode of a light emitting device includes a reflective metal, and a cathode of the light emitting device includes a transflective metal. Therefore, light from by a light emitting layer located between the anode and the cathode is reflected by the reflective anode and resonates a plurality of times between the anode and the cathode, and light of a specific wavelength according to a distance between the anode and the cathode is emitted. In such a structure, in order to further increase transmission efficiency, an effort to reduce the thickness of the cathode is made. However, since, if a single metal having transflectivity used as the cathode is deposited, metal particles aggregate and thus surface uniformity is lowered, an alloy of such a metal is mainly used. However, it is very difficult to reduce the thicknesses of a cathode formed of a single metal or a cathode formed of a metal alloy to a designated level or less in order to achieve film uniformity and high temperature stability.

In particular, in a display device having both a light emission area and a light transmission area, a cathode should be shared by the light emission area and the light transmission area, and thus light transmittance is remarkably lowered by the cathode remaining in the light transmission area.

SUMMARY

Accordingly, the present disclosure is directed to a light emitting device which controls organic layers contacting a cathode to improve bonding force at the interfaces between the cathode and the organic layers and thus to reduce the thickness of the cathode and a transparent display device using the same that substantially obviate one or more problems due to limitations and disadvantages of the related art.

An object of the present disclosure is to provide a light emitting device which includes a cathode electrode and organic layers formed of an organic compound including a large number of lone-pair electrons and may thus prevent aggregation of metal particles in the cathode and secure reliability even at a high temperature.

Another object of the present disclosure is to provide a transparent display device using a light emitting device which secures reliability of a cathode and may thus reduce the thickness of the cathode and improve transmittance of the cathode.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, a light emitting device includes an anode, a light emitting layer on the anode, and an electron transport layer on the light emitting layer, the electron transport layer including a first component and a second component, and a cathode. The first component includes a heterocyclic compound having atoms with lone-pair electrons and the second component includes at least one of an electron-injecting metal or an electron-injecting metal compound. A volume of the second component in the electron transport layer is less than a volume of the first component in the electron transport layer. The cathode includes a metal component.

The cathode may include a first surface and a second surface opposite the first surface. The light emitting device may further include a first organic layer on the first surface of the cathode. The first organic layer may include a same material as the first component. The electron transport layer may be on the second surface of the cathode.

The electron transport layer may be in contact with the second surface of the cathode and the first organic layer may be in contact with the first surface of the cathode.

An upper surface of the electron transport layer may include horizontally continuous bonds between the atoms with lone-pair electrons in the electron transport layer and the metal component constituting the cathode. The upper surface may be between the electron transport layer and the cathode.

The first surface of the cathode that is between the first organic layer and the cathode may include bonds between the atoms with lone-pair electrons in the first organic layer and the metal component constituting the cathode.

An interface between the cathode and the electron transport layer may include a bonding layer having horizontally continuous arrangement of the bonds between the atoms with lone-pair electrons and the metal component constituting the cathode, and particles of the metal component constituting the cathode may be arranged as a layered structure on the bonding layer. The layered structure may include a plurality of layers of the particles of the metal component constituting the cathode.

The metal component of the cathode may include one of a transflective metal or a transflective metal alloy.

The metal component of the cathode may further include a transition metal.

The electron-injecting metal of the electron transport layer may be one selected from a transition metal, an alkali metal and an alkali earth metal.

The electron-injecting metal compound of the electron transport layer may include lithium quinoline.

The first organic layer may further include a transition metal.

The cathode may have a thickness of 100 Å or less.

In another aspect of the present disclosure, a transparent display device includes a substrate including a light emission area that emits light and a light transmission area that transmits light, and a light emitting device. The light emitting device includes an anode, a light emitting layer on the anode, an electron transport layer on the light emitting layer, and a cathode on the light emitting layer. The electron transport layer includes a first component and a second component. The first component includes a heterocyclic compound having atoms with lone-pair electrons and the second component includes at least one of an electron-injecting metal or an electron-injecting metal. A volume of the second component is less than a volume of the first component in the electron transport layer. The cathode includes a metal component and is disposed in both the light emitting area and the light transmission area.

The transparent display device may further include a second organic layer provided between the anode and the light emitting layer.

The second organic layer may be provided throughout the light emission area and the light transmission area.

The above-described configuration of the light emitting device may be applied to the transparent display device.

In another aspect of the present disclosure, an electronic device includes an anode, an organic layer on the anode, and a cathode. For example, the electronic device may include a light-emitting device, a solar cell, a battery, etc. The organic layer includes a first component and a second component. The first component includes a heterocyclic compound having atoms with lone-pair electrons. The second component includes at least one of an electron-injecting metal or an electron-injecting metal compound. The volume of the second component is less than a volume of the first component in the organic layer. The cathode includes a metal component.

The cathode may include a first surface and a second surface opposite the first surface. The electronic device may further include an additional organic layer on the first surface of the cathode. The additional organic layer may include a same material as the first component. The organic layer may be on the second surface of the cathode.

The additional organic layer may further include at least one of a same material as the electron-injecting metal or the electron-injecting metal compound of the second component.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure.

FIGS. 14A, 14B, 14C, 14D, 14E, 14F, 14G, and 14H are cross-sectional views illustrating stack structures of a cathode and organic layers contacting the cathode in accordance with various embodiments of the present disclosure.

DETAILED DESCRIPTION

Figure 1:
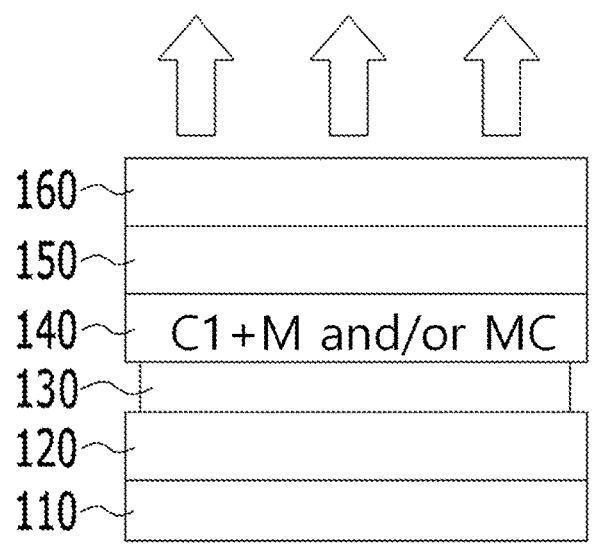
FIG. 1 is a cross-sectional view illustrating a light emitting device in accordance with the present disclosure.

Reference will now be made in detail to the preferred embodiments of the present disclosure, examples of which are illustrated in the accompanying drawings. However, the present disclosure may be embodied in many alternative forms and should not be construed as limited to the embodiments set forth herein, and the embodiments of the present disclosure are provided only to completely disclose the present disclosure and to completely inform those skilled in the art of the scope of the present disclosure. Further, the names of elements used in the following description of the embodiments of the present disclosure are selected in consideration of ease in preparation of the specification, and may thus differ from the names of parts of an actual product.

Shapes, sizes, rates, angles, numbers, etc. disclosed in the drawings to describe the embodiments of the present disclosure are only exemplary and do not limit the present disclosure. In the following description of the embodiments and the drawings, the same or similar elements are denoted by the same reference numerals even though they are depicted in different drawings. In the following description of the embodiments of the present disclosure, a detailed description of known functions and configurations incorporated herein will be omitted when it may make the subject matter of the present disclosure rather unclear. In the following description of the embodiments, the terms 'including', 'having', 'comprising', etc. will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element includes a plural expression of the element unless stated otherwise.

In interpretation of elements included in the various embodiments of the present disclosure, it will be interpreted that the elements include error ranges even if there is no clear statement.

In the following description of the embodiments, it will be understood that, when positional relations are expressed, for example, when an element is 'on', 'above', 'under', 'beside', etc. another element, the two elements may directly contact each other, or one or more other elements may be interposed between the two elements unless the term 'just' or 'directly' is used.

In the following description of the embodiments, it will be understood that, when temporal relations are expressed, for example, a term expressing a sequence of events, such as 'after', 'subsequent to', 'next to' or 'before' may encompass continuous relationship between the events, or discontinuous relationship between the events unless the term 'just' or 'directly' is used.

In the following description of the embodiments, it will be understood that, when the terms 'first', 'second', etc. are used to describe various elements, these terms are used merely to discriminate the same or similar elements. Therefore, an element modified by the term 'first' may be the same as an element modified by the term 'second' within the technical scope of the present disclosure unless stated otherwise.

Characteristics of the various embodiments of the present disclosure may be partially or entirely connected to or combined with each other and technically variously driven and interlocked with each other, and the respective embodiments may be independently implemented or be implemented together in connection with each other.

Figure 2:
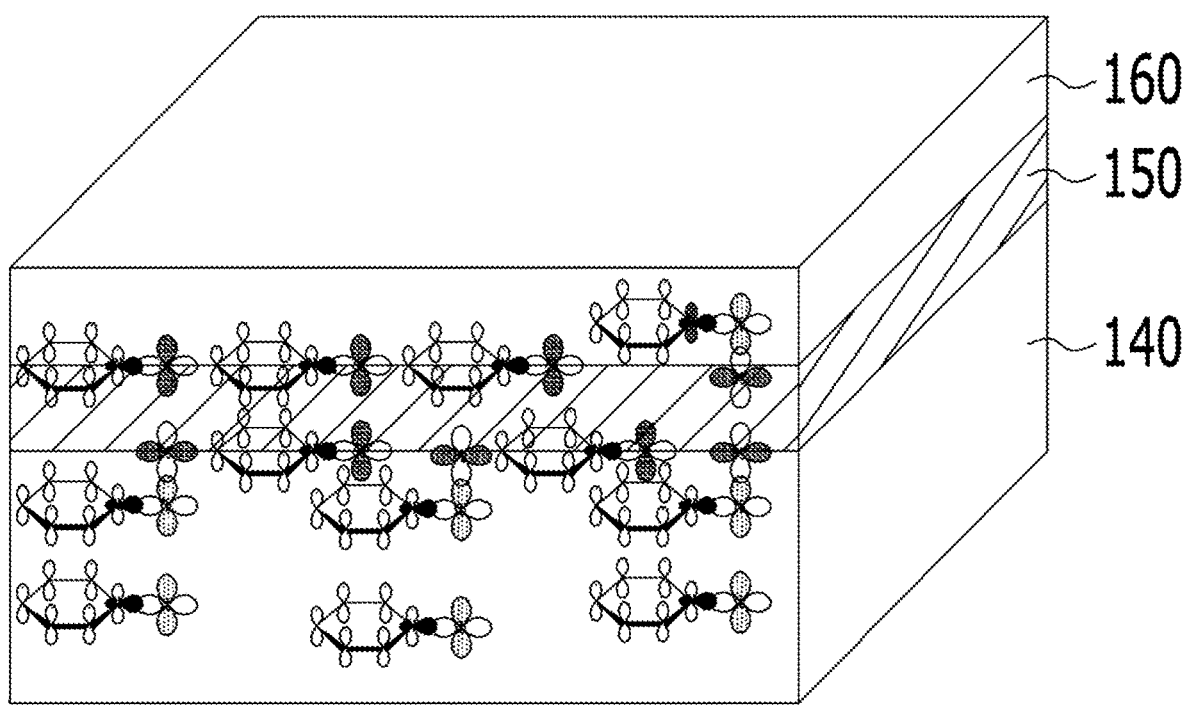
FIG. 2 is a perspective view illustrating a cathode and organic layers located on and under the cathode of FIG. 1.

FIG. 1 is a cross-sectional view illustrating a light emitting device in accordance with the present disclosure, and FIG. 2 is a perspective view illustrating a cathode and organic layers located on and under the cathode of FIG. 1. Embodiments of this disclosure are not limited to a light emitting device and may also include other embodiments such as an electronic device which may include a light-emitting device, a solar cell, a battery, or any type of electronic device including an electrode (e.g., cathode) and an organic layer.

As exemplarily shown in FIG. 1, a light emitting device in accordance with one embodiment of the present disclosure includes an anode 110 and a cathode 150 disposed opposite to each other, a light emitting layer 130 located between the anode 110 and the cathode 150, and an electron transport layer 140 located between the light emitting layer 130 and the cathode 150 and including a first component including a heterocyclic compound C1 having atoms with lone-pair electrons and a second component including at least one of an electron-injecting metal M and an electron-injecting metal compound MC of a lower content than that of the first component (e.g., a volume of the second component may be lower than a volume of the first component), the atoms with lone-pair electrons being bonded to a metal component constituting the cathode 150. The cathode 150 may include a metal component. The metal component of the cathode may include one of a transflective metal or a transflective metal alloy. The cathode 150 may further include a transition metal.

The electron transport layer 140 includes a dopant of a low content with the second component having electron injecting characteristics (the electron-injecting metal M or the electron-injecting metal compound MC), and thus, formation of an additional electron injection layer between the electron transport layer 140 and the cathode 150 may be omitted and the electron transport layer 140 directly contacts the cathode 150.

Here, the electron transport layer 140 includes a large amount, i.e., a host content of the first component C1 including the atoms of lone-pair electrons, and thus the lone-pair electrons are directly bonded to the metal component constituting the cathode 150. Therefore, aggregation of metal particles of the metal component in the cathode 150 may be prevented even under poor conditions of a high temperature due to bonding between the metal component of the cathode 150 and the atoms with lone-pair electrons in the electron transport layer 140.

Here, inclusion of the host content of the first component C1 in the electron transport layer 140 means that the first component C1 in the electron transport layer 140 is used as a main component and a first component content of the electron transport layer 140 is 50% or more, particularly 80% or more, of the total volume of the electron transport layer 140, and, through such a high first component content, the first component C1 may uniformly react with the metal component constituting the cathode 150 at the interface between the electron transport layer 140 and the cathode 150.

The first component C1 may be one of a heterocyclic organic compound using nitrogen as the atoms with lone-pair electrons, as expressed in following chemical formulas 1 to 4.

[Chemical Formula 1]

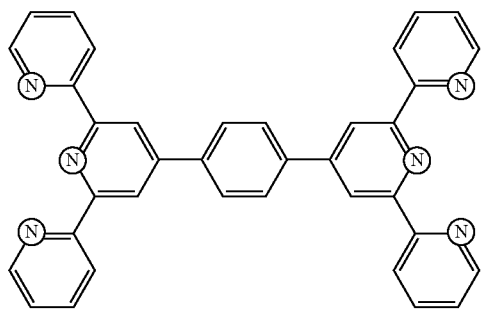

[Chemical Formula 2]

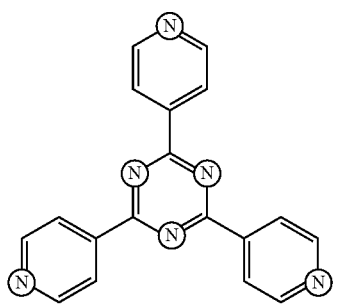

[Chemical Formula 3]

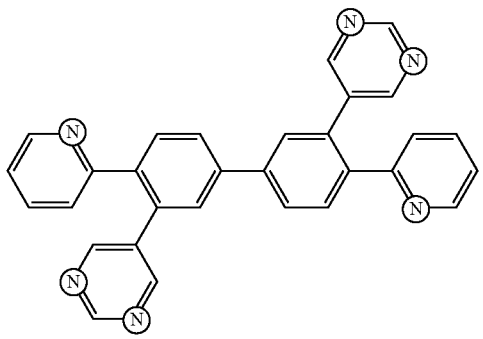

[Chemical Formula 4]

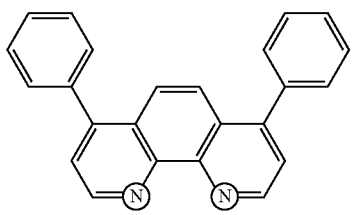

The compounds expressed in the above-described chemical formulas 1 to 4 are only examples of the first component C1, and other heterocyclic organic compounds which include a large number of lone-pair electrons and thus have excellent bonding force with metal may be used as the first component C1.

The first component C1 includes one or more heteroatoms with lone-pair electrons per 3 conjugated carbon rings, and the heteroatoms may be, for example, nitrogen atoms, oxygen atoms, sulfur atoms, or the like.

Further, the second component M or MC is a component having an electron injecting property, and may include a metal, such as a transition metal, an alkali metal, an alkali earth metal, or the like. Although, in the following test examples, ytterbium (Yb) is used as the transition metal, lithium (Li) is used as the alkali metal and calcium (Ca) is used as the alkali earth metal, the second component is not limited thereto and one selected from the above-described series metals may be employed.

Further, the metal compound having the electron injecting property may be formed by combining the above-described metal with an organic compound, such as quinoline. For example, lithium quinoline (Liq) may be a representative metal compound.

Referring to FIG. 2, bonding in the electron transport layer 140 will be described. The electron transport layer 140 includes a heterocyclic compound including nitrogen atoms with lone-pair electrons as the first component C1 and, here, the nitrogen atoms are substituted for some of carbon sites of a benzene ring. Further, the electron transport layer 140 includes ytterbium (Yb), i.e., a transition metal component, as the second component.

In this case, ytterbium (Yb) having the electron injecting property used as the second component which is periodically formed according to arrangement of the lone-pair electrons may be uniformly formed to have the smallest thickness over or directly on the surface of the electron transport layer 140 though metallic bonding with silver (Ag) in the cathode 150. Further, the lone-pair electrons which are not bonded to the transition metal (Yb) are directly bonded to the metal component (Ag) of the cathode 150 and may thus prevent melting and aggregation of the cathode 150 at a high temperature. For reference, silver (Ag), which is mainly included in the cathode 150 to exhibit a transflective property in a top emission type, has optically excellent transflectivity, but if silver (Ag) alone is used, silver (Ag) particles tend to aggregate and thus, in order to prevent such aggregation, a silver (Ag) alloy including Mg is used to form the cathode 150. In the light emitting device in accordance with the present disclosure, even if the cathode 150 is formed of silver (Ag) alone, aggregation of silver (Ag) particles in the cathode 150 may be prevented through bonding between atoms with lone-pair electrons and silver (Ag).

In the electron transport layer 140, the lone-pair electrons are bonded to the metal (ytterbium (Yb): the second component) in the electron transport layer 140 and may thus achieve uniform doping with the metal M or the metal compound MC used as the dopant, and strong bonding between the atoms with lone-pair electrons and the metal or metal compound around the lone-pair electrons prevents the metal or metal compound from being substituted by another atoms or being diffused in a high-temperature environment and may thus achieve stable driving of the light emitting device.

Further, transporting characteristics, for example, trap density and conductivity, of the electron transport layer 140 are controllable according to the concentration of the second component as a dopant, i.e., the metal M or the metal compound MC. Optimization of charge balance is possible without change in a structure of the electron transport layer 140 in various device structures by controlling a doping concentration and a doping region through varying the content of the second component or scanning of the second component as the dopant in a formation process of the electron transport layer 140.

The light emitting device of FIG. 1 represents an example in which a first organic layer 160 including a same material as the first component C1 so as to form bonding between the lone-pair electrons and the metal component in the cathode 150 is formed on the upper surface of the cathode 150. The first organic layer 160 may function as a capping layer having functions of improving stability of the surface of the cathode 150, protecting the light emitting device and improving light extraction efficiency.

A hole transport layer 120 having a hole transport function may be further provided between the anode 110 and the light emitting layer 130.

Further, the light emitting device in accordance with the present disclosure is operated as a top emission type in which light is emitted to the cathode 150 in the upward direction, and, for this purpose, the anode 110 includes a reflective electrode, the cathode 150 includes a transflective electrode, and light emitted by the light emitting layer 130 undergoes reflection and resonance between the cathode 150 and the anode 110 and is emitted to the cathode 150.

In the light emitting device in accordance with the present disclosure, the electron transport layer 140 includes the first component C1 including an organic compound having atoms with lone-pair electrons and the second component including an electron-injecting metal M or an electron-injecting metal compound MC, and the atoms with lone-pair electrons are bonded to a metal component in the cathode 150 and may thus prevent movement of the metal component in the cathode in a severe environment of a high temperature and secure interfacial stability.

Further, as exemplarily shown in FIG. 1, if the first organic layer 160 including the same material of the first component C1 including the organic compound is further provided on the upper surface of the cathode 150, the electron transport layer 140 and the first organic layer 160 provided on the lower and upper surfaces of the cathode 150 trap the metal component constituting the cathode 150 with designated bonding force, and thus interfacial stability on both surfaces of the cathode 150 may be secured.

Figure 3:
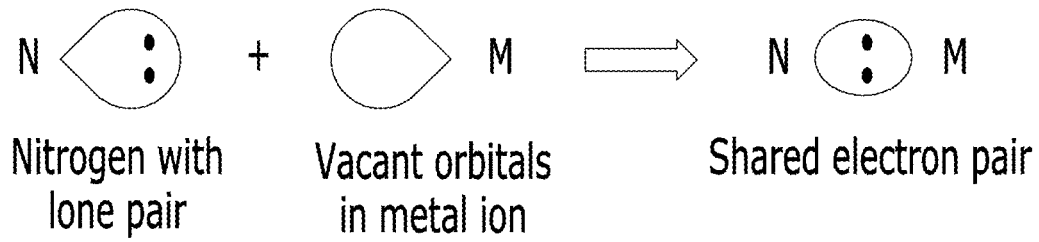
FIG. 3 is a model diagram of a formula representing bonding between an atom with lone-pair electrons included in a compound forming the organic layers located on and under the cathode of FIG. 2 and a metal component constituting the cathode or a second component.
Figure 4:
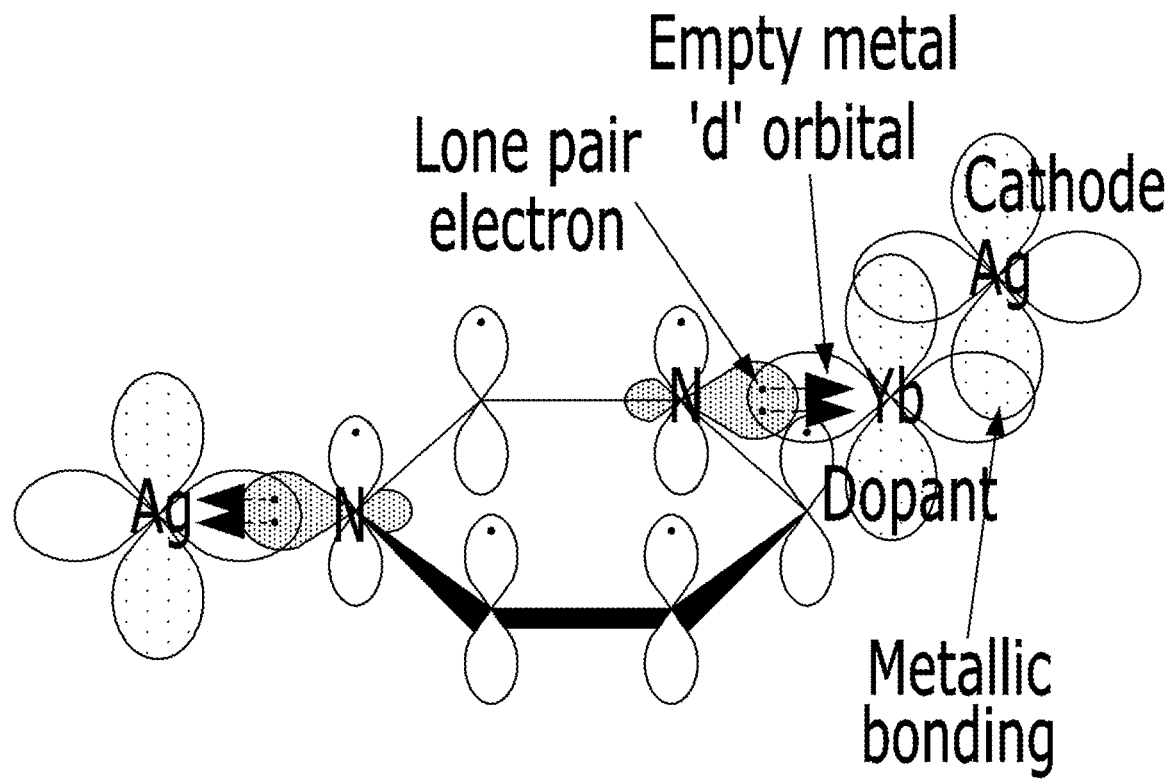
FIG. 4 is a schematic view illustrating bonding between the atoms with lone-pair electrons and the metal component constituting the cathode or the second component and bonding between the second component and the metal component constituting the cathode, shown in FIG. 2.

FIG. 3 is a model diagram of a formula representing bonding between the atom with lone-pair electrons included in the compound forming the organic layers located on and under the cathode of FIG. 2 and the metal component constituting the cathode or the second component, and FIG. 4 is a schematic view illustrating bonding between the atoms with lone-pair electrons and the metal component constituting the cathode or the second component and bonding between the second component and the metal component constituting the cathode, shown in FIG. 2.

As exemplarily shown in FIG. 4, in the aromatic heterocyclic compound as the first component C1, a density of state of electrons in other parts of the atom except for the lone-pair electrons is delocalized and, thus, if a metal is adjacent to the heterocyclic compound and the heterocyclic compound is doped with a metal, the metal is bonded to the lone-pair electrons and strong bonding between the dopant metal (FIG. 4 exemplarily illustrating ytterbium (Yb)) and the electron transport layer 140 is induced. Here, the atom (N) with the lone-pair electrons is pulled to an empty 'd' orbital of an Ag ion of the metal component of the cathode 150 or an Yb ion of the transition metal included as the second component and thus bonding therebetween is induced.

The electron transport layer 140 of the present disclosure is doped with the second component, such as a transition metal, an alkali metal, an alkali earth metal, lithium quinoline (Liq) or the like, and may secure an electron injecting property by such a metal or lithium quinoline (Liq) without separate formation of an electron injection layer. That is, the metal included in the electron transport layer 140 as the second component is metallically bonded to the metal in the cathode 150, thus maintaining alignment of metal particles in the cathode 150 and preventing aggregation of the metal particles in the cathode 150. Further, since the lone-pair electrons fix the metal by bonding force with the metal, a diffusion path of the metal in the cathode 150 is shortened, the metal dopant is not moved at the interface between the cathode 150 and the electron transport layer 140 even in a high-temperature environment and thus stable driving of the light emitting device is possible, and carriers, such as electrons, are not accumulated at the interface and thus improvement in the lifespan of the light emitting device is expected.

The atoms with lone-pair electrons in the organic compound of the first component C1 of the present disclosure may be atoms of nitrogen, as expressed in chemical formulas 1 to 4, without being limited thereto, and may be atoms of oxygen, sulfur, or the like. In this case, whether or not an element is usable as the first component is determined according to whether or not the element has a sufficient number of lone-pair electrons.

In the light emitting device in accordance with the present disclosure, since the metal or the metal compound of the second component in the electron transport layer 140 is located according to the structure of the first component C1 included as a main component (a host), the electron transport layer 140 may have a densely stacked structure having a high density.

Therefore, in the light emitting device in accordance with the present disclosure, the cathode 150 having a thin thickness of 100 Å or less which is stable at a high temperature and has high transmissivity may be formed by doping the first component C1 having a sufficient amount of lone-pair electrons with the metal M or the metal compound MC as the second component, and the number of layers may be reduced by omitting an electron injection layer from the structure of the light emitting device.

Figure 5:
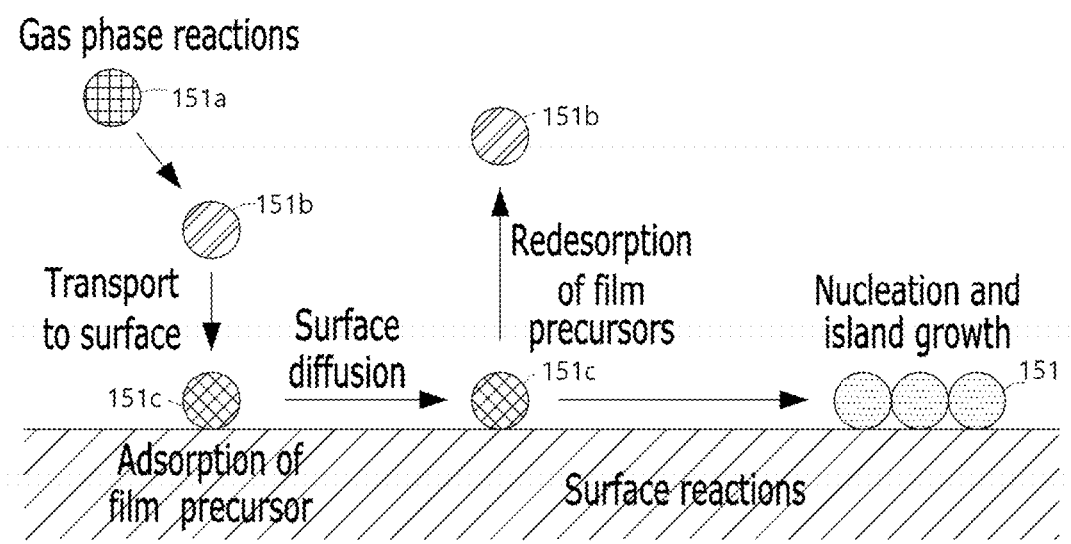
FIG. 5 is a view illustrating a principle of constituting the cathode on an electron transport layer.

FIG. 5 is a view illustrating a principle of constituting the cathode on the electron transport layer.

As exemplarily shown in FIG. 5, when first metal particles 151a in a gas phase are supplied to the surface of the electron transport layer 140, the first metal particles 151a in the gas phase are converted into first metal particles 151b in a fluid phase, and the first metal particles 151b in the fluid phase are adsorbed onto the surface of the electron transport layer 140, as second metal particles 151c. When the second metal particles 151c are diffused on the surface of the electron transport layer 140, some of the second metal particles 151c are desorbed from the surface of the electron transport layer 140 and are returned to the first metal particles 151b in the fluid phase, and the remaining second metal particles 151c are arranged as an island type on the surface of the electron transport layer 140 and thus function as nuclei for uniform layered arrangement of the first metal particles 151a in the gas phase which are subsequently supplied, and grow to be particles 151.

In the light emitting device in accordance with the present disclosure, the dopant formed of the metal M uniformly formed on the surface of the electron transport layer 140 along arrangement of the lone-pair electrons functions as centers of the nuclei when the cathode 150 formed of silver (Ag) as a base material is deposited on the electron transport layer 140, and thus the cathode 150 may be formed as a uniform and thin film, and diffusion of the metal in the cathode 150 in a high-temperature environment may be prevented by bonding force among the dopant of the electron transport layer 140, the lone-pair electrons and the metal component constituting the cathode 150.

Hereinafter, significance of the structure of the light emitting device in accordance with the present disclosure will be described through various tests.

Hereinafter, an electron transport layer with no lone-pair electrons used in the tests exemplarily employs an anthracene compound.

[Test 1]

Figure 6A:
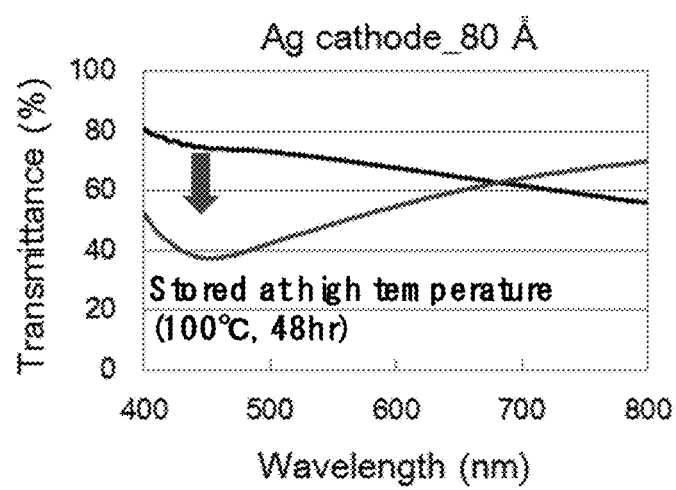
FIG. 6A is a graph representing light transmittances of a cathode film formed of a single metal according to wavelength when stored at room temperature and stored at a high temperature.
Figure 6B:
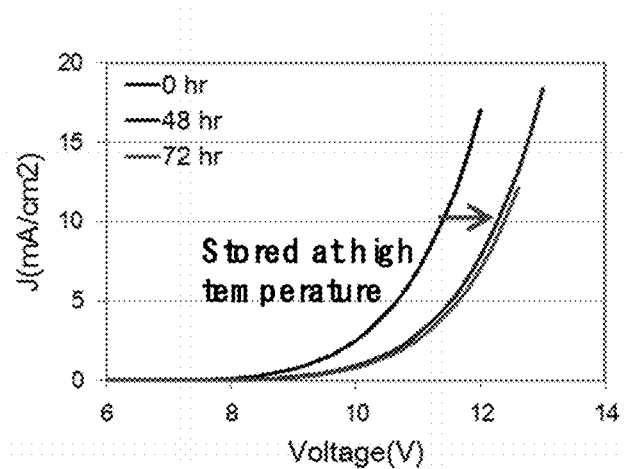
FIG. 6B is a graph representing change in voltage-current density characteristics of a structure in which a cathode film formed of an alloy is formed on an electron transport layer with no lone-pair electrons when stored at a high temperature.

FIG. 6A is a graph representing light transmittances of a cathode film formed of a single metal according to wavelength when stored at room temperature and stored at a high temperature, and FIG. 6B is a graph representing change in voltage-current density characteristics of a structure in which a cathode film formed of an alloy is formed on an electron transport layer with no lone-pair electrons when stored at a high temperature.

As exemplarily shown in FIG. 6A, if a cathode film formed of silver (Ag) alone was formed to have a small thickness of 80 Å on the electron transport layer with no lone-pair electrons, light transmittance of the cathode film was changed from 80% to 60% as light was changed from a short wavelength of about 400 nm to a long wavelength of about 700 nm in the visible wavelength range, and thus had a small deviation within the range of 20% according to wavelength, when such a stack structure was stored at room temperature, but light transmittance of the cathode film was decreased as the wavelength of light was increased in the wavelength range of 400 nm to 500 nm, and then increased as light was gradually changed to a longer wavelength, when the stack structure was stored at a high temperature of 100° C. for 48 hours. Light transmittance of the cathode film when stored at a high temperature tends to be in opposition to light transmittance of the cathode film when is stored at room temperature, which means that a light emitting device manufactured using the cathode film has characteristics in opposition to a design value considered as an initial value in a high-temperature environment and thus reliability of the light emitting device cannot be expected.

Further, as exemplarily shown in FIG. 6B, in a stack structure in which a cathode film formed of an AgMg alloy is formed directly on the electron transport layer with no lone-pair electrons, it may be confirmed that, as the storage time of the stack structure at a high temperature of 100° C. was gradually increased from 0 hour to 48 hours and 72 hours, a voltage to achieve the same current density was increased. In this test, the AgMg alloy film used as a cathode was formed to have a thickness of 70 Å, and, in this case, as the high-temperature storage time of the stack structure was increased, driving voltage to achieve the same current density was increased, as compared to a case in which the stack structure was not stored at a high temperature.

Through test 1, it may be understood that light transmittance of a metal cathode formed by thermal vacuum deposition was sensitive to thickness and composition thereof, and, when the thickness of the Ag-based cathode having low light absorption was reduced to 80 Å or less so as to increase light transmittance, the cathode exhibited high light transmittance of 70% or more in a visible wavelength range, but when placed in a high-temperature environment, high surface plasmon resonance (SPR) loss occurred due to aggregation of the cathode and light transmittance of the cathode in the visible wavelength range was rapidly decreased. Particularly, a display device is generally designed such that a wavelength of a range of 500 nm to 600 nm occupies a large part of luminance as compared to wavelengths of other ranges, and thus, if such a metal cathode formed of a single component and thus having low transmittance due to storage at a high temperature is applied to a display device, the display device loses reliability.

Further, the cathode having property change in a high-temperature environment changes driving voltage and it may be expected that light emitting characteristics of the light emitting device using the cathode at a high temperature are lowered.

In order to solve such problems, an element to prevent metal diffusion in the cathode, such as an electron injection layer formed of an electron injecting material including a transition metal, an alkali metal, an alkali earth metal, or the like, may be used, but, if the electron injection layer is additionally provided between the electron transport layer and the cathode, the electron injection layer reduces transmittance and is difficult to apply to a transparent display device.

[Test 2]

Figure 7A:
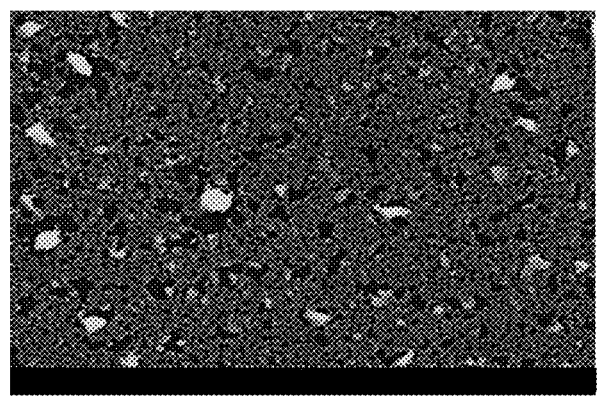
FIG. 7A is a scanning electron micrograph (SEM) representing surface change of a single Ag film formed on an electron transport layer formed of a single compound with no lone-pair electrons, after 250 hours elapsed.
Figure 7B:
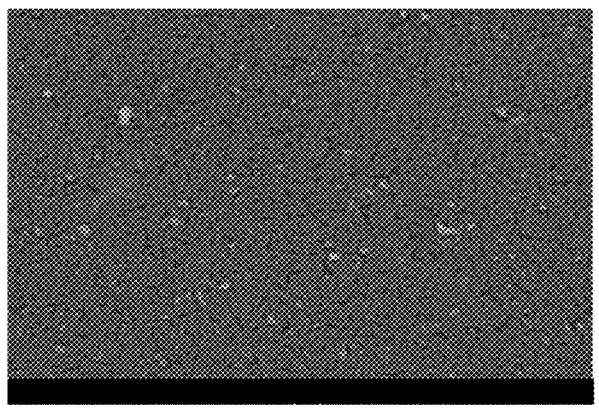
FIG. 7B is a scanning electron micrograph (SEM) representing surface change of a single Ag film formed on an electron transport layer formed of a double compound with no lone-pair electrons, after 250 hours elapsed.

FIG. 7A is a scanning electron micrograph (SEM) representing surface change of a single Ag film formed on an electron transport layer formed of a single compound with no lone-pair electrons (an anthracene compound), after 250 hours elapsed, and FIG. 7B is a scanning electron micrograph (SEM) representing surface change of a single Ag film formed on an electron transport layer formed of a double compound with no lone-pair electrons, after 250 hours elapsed.

As exemplarily shown in FIG. 7A, it may be confirmed that, when a single Ag film was formed on an electron transport layer formed of a single compound with no lone-pair electrons (an anthracene compound), aggregation of Ag particles was observed, after 250 hours elapsed. As exemplarily shown in FIG. 7B, it may be confirmed that, when a single Ag film is formed on an electron transport layer formed of a double compound with no lone-pair electrons (an anthracene compound+Liq), aggregation of Ag particles was reduced as compared to the single Ag film of FIG. 7A, after 250 hours elapsed. It may be expected that the added Liq component partially reacts with the Ag component of the cathode.

[Test 3]

Figure 8A:
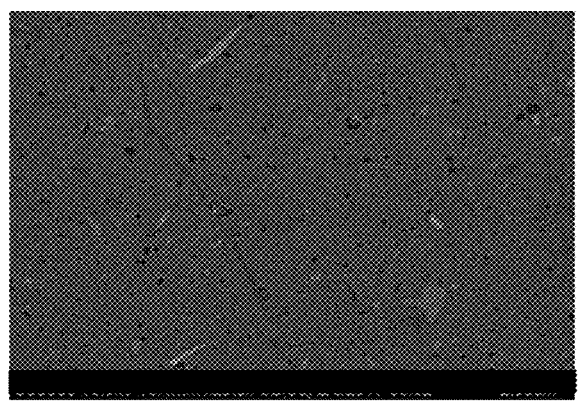
FIG. 8A is a scanning electron micrograph (SEM) representing surface change of a single Ag film formed on an electron transport layer formed of a single compound with lone-pair electrons, after 250 hours elapsed.
Figure 8B:
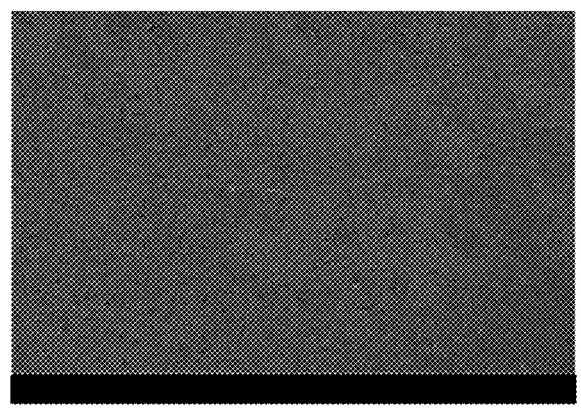
FIG. 8B is a scanning electron micrograph (SEM) representing surface change of a single Ag film formed on an electron transport layer formed of a double compound including an organic compound with lone-pair electrons and lithium quinoline (Liq), after 250 hours elapsed.

FIG. 8A is a scanning electron micrograph (SEM) representing surface change of a single Ag film formed on an electron transport layer formed of a single compound with lone-pair electrons, after 250 hours elapsed, and FIG. 8B is a scanning electron micrograph (SEM) representing surface change of a single Ag film formed on an electron transport layer formed of a double compound including an organic compound with lone-pair electrons and lithium quinoline (Liq), after 250 hours elapsed.

As exemplarily shown in FIG. 8A, it may be confirmed that, when a single Ag film was formed on an electron transport layer formed of a single compound with lone-pair electrons (expressed in chemical formula 1), some aggregation of Ag particles was observed, after 250 hours elapsed, but aggregation of Ag particles of the single Ag film was reduced as compared to the structure of FIG. 7B in which the electron transport layer is formed of the double compound. This means that, even if a cathode is formed of Ag alone, aggregation of Ag particles of the cathode in a high-temperature environment may be prevented by adjusting components of a lower organic layer or lower organic layers.

As exemplarily shown in FIG. 8B, it may be confirmed that, when a single Ag film was formed on an electron transport layer formed of a double compound including an organic compound with lone-pair electrons (expressed in chemical formula 1) and lithium quinoline (Liq), even after aging at a high temperature, aggregation of Ag particles was scarcely observed, after 250 hours elapsed. This means that this structure is more effective than the structure of FIG. 8A, i.e., aggregation of Ag particles is effectively prevented by doping the organic compound with lone-pair electrons of the electron transport layer with an electron-injecting metal compound, such as lithium quinoline (Liq).

Hereinafter, significance of the light emitting device in accordance with the present disclosure will be described through test 4 in which cathode films are exposed to a high-temperature environment for a longer time.

[Tests 4 and 5]

Figure 9A:
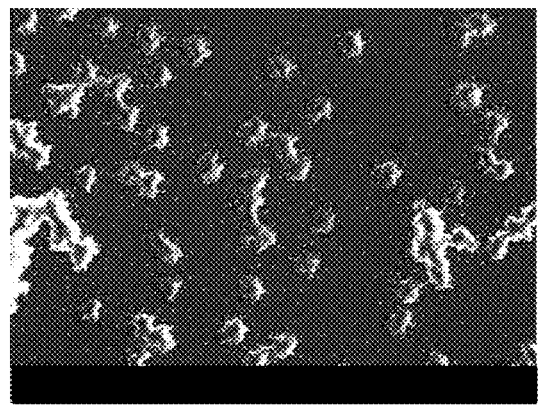
FIGS. 9A and 9B are scanning electron micrographs (SEMs) representing surface change of a cathode formed of an AgMg alloy film on an electron transport layer formed of a single compound with no lone-pair electrons, after 500 hours elapsed.
Figure 9B:
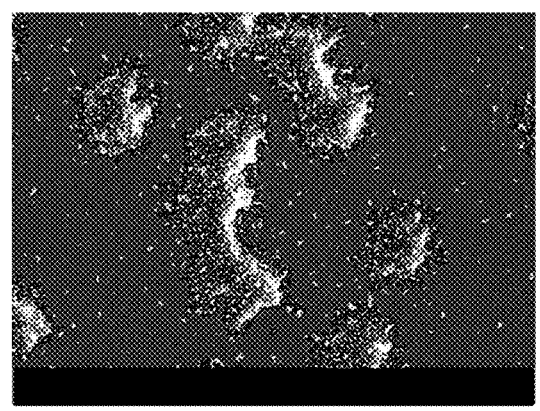
Figure 10A:
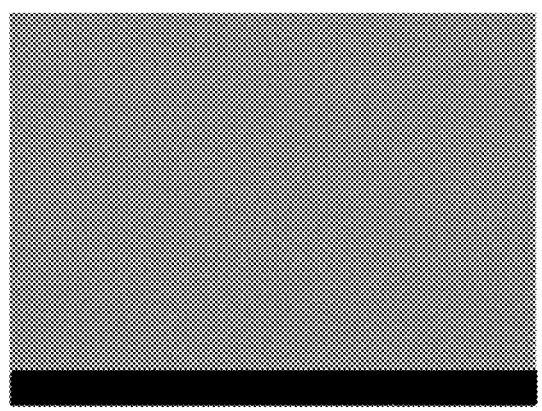
FIGS. 10A and 10B are scanning electron micrographs (SEMs) representing surface change of a cathode formed of an AgMg alloy film on an electron transport layer formed by doping an organic compound with lone-pair electrons with ytterbium (Yb), after 500 hours elapsed.
Figure 10B:
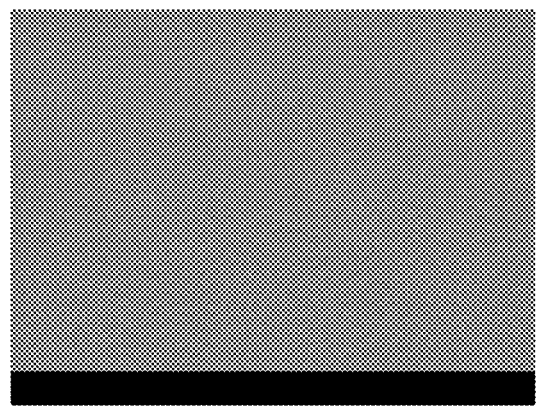
Figure 11A:
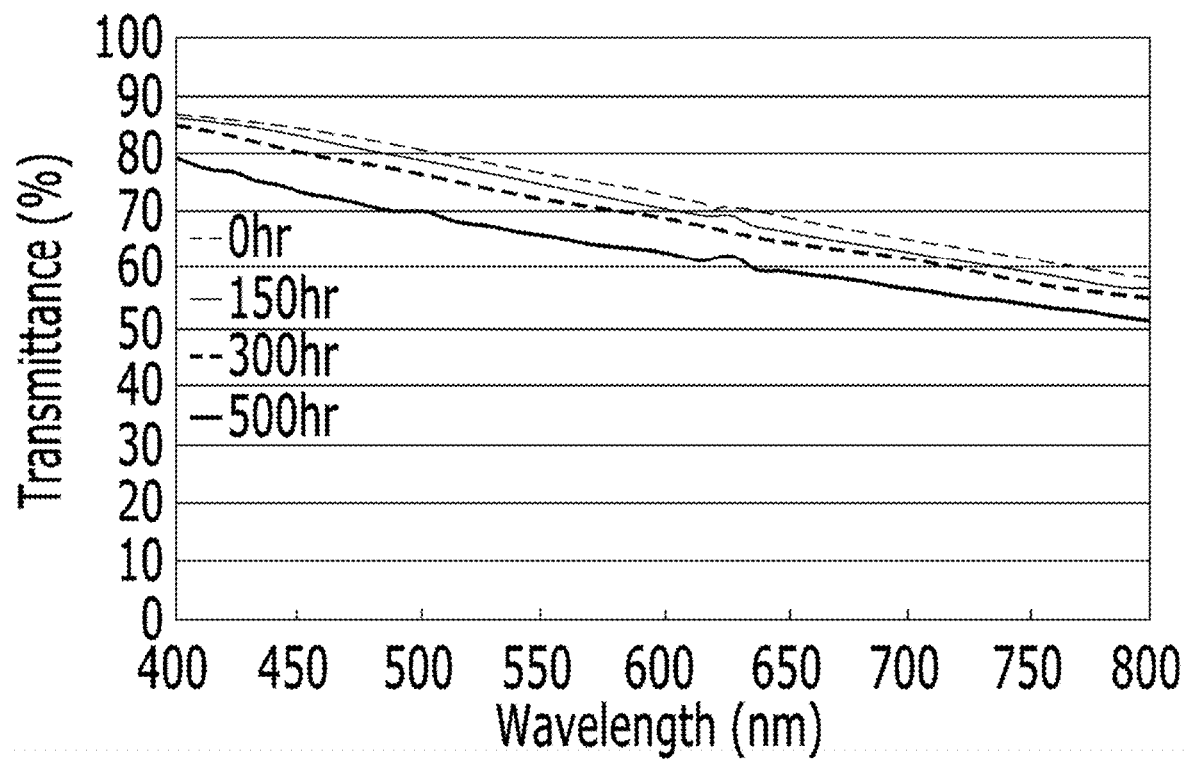
FIGS. 11A and 11B are graphs representing light transmittances of the cathodes of FIGS. 9A and 10A according to wavelength.
Figure 11B:
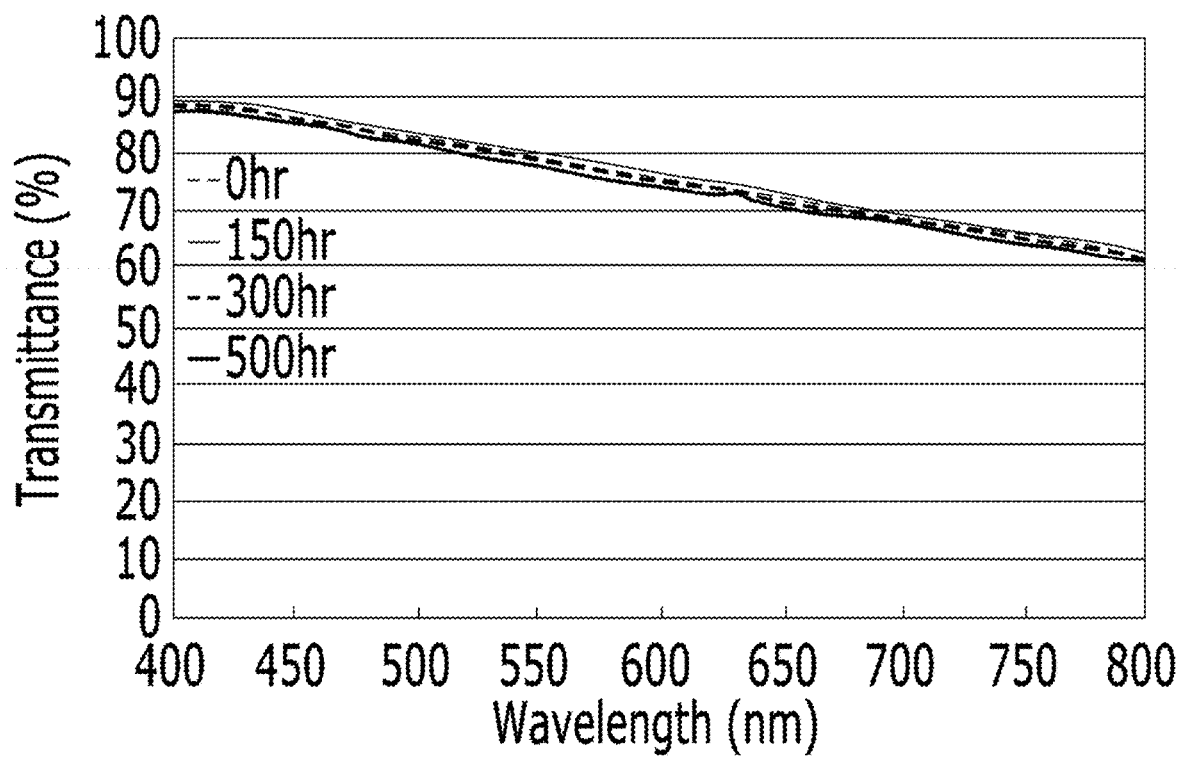

FIGS. 9A and 9B are scanning electron micrographs (SEMs) representing surface change of a cathode formed of an AgMg alloy film on an electron transport layer formed of a single compound with no lone-pair electrons, after 500 hours elapsed. FIGS. 10A and 10B are scanning electron micrographs (SEMs) representing surface change of a cathode formed of an AgMg alloy film on an electron transport layer formed by doping an organic compound with lone-pair electrons with ytterbium (Yb), after 500 hours elapsed. Further, FIGS. 11A and 11B are graphs representing light transmittances of the cathodes of FIGS. 9A and 10A according to wavelength.

FIG. 9B is an enlarged SEM of FIG. 9A by 2.5 times, and similarly, FIG. 10B is an enlarged SEM of FIG. 10A by 2.5 times.

In test 4, when a cathode formed of a metal alloy film was respectively formed on an electron transport layer formed of a single compound with no lone-pair electrons and an electron transport layer formed by doping an organic compound with lone-pair electrons with ytterbium (Yb), whether or not Ag particles in the respective cathodes aggregated was checked.

As exemplarily shown in FIGS. 9A and 9B, through surface change of the cathode formed of the AgMg alloy film which was formed on the electron transport layer formed of the single compound with no lone-pair electrons, after 500 hours elapsed, it may be confirmed that, even if the cathode further includes Mg in order to prevent aggregation of Ag particles, aggregation of Ag particles in a high-temperature environment was not avoided.

On the other hand, as exemplarily shown in FIGS. 10A and 10B, through surface change of the cathode formed of the AgMg alloy film which was formed on the electron transport layer formed by doping the organic compound with lone-pair electrons with ytterbium (Yb), after 500 hours elapsed, it may be confirmed that no aggregation of Ag particles was observed.

In test 5, light transmittances of the same film structures as in test 4 as time passed were checked.

In more detail, as exemplarily shown in FIGS. 11A and 11B representing change in light transmittances of the cathodes according to wavelength when a holding time is varied, it may be confirmed that, as exemplarily shown in FIG. 11A, in the structure in which the organic compound with no lone-pair electrons is used to form the electron transport layer, even if the cathode is formed of the alloy film, when a time taken to expose the structure to a high-temperature environment is increased, light transmittance of the cathode is decreased. On the other hand, as exemplarily shown in FIG. 11B, it may be confirmed that, in the structure in which the electron transport layer is formed by doping the organic compound with lone-pair electrons with a transition metal, such as ytterbium (Yb), even if the cathode is formed to have a small thickness of 50 Å, interfacial stability of the cathode is secured, thermal stability of the cathode is greatly improved and the cathode may maintain uniform thin film characteristics and high transmittance.

In tests 4 and 5, the cathodes were formed in common of the AgMg alloy film having a composition ratio of 20:1 so that Ag is used as a main component of the cathodes, and had a thin thickness of 50 Å so as to maintain light transmittance.

[Test 6]

Figure 12A:
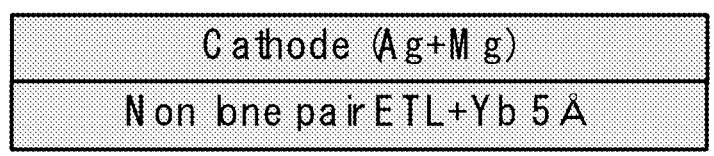
FIGS. 12A, 12B, and 12C are cross-sectional views exemplarily illustrating various stack structures of an electron transport layer and an alloy cathode, which are applied to test 6.
Figure 12B:
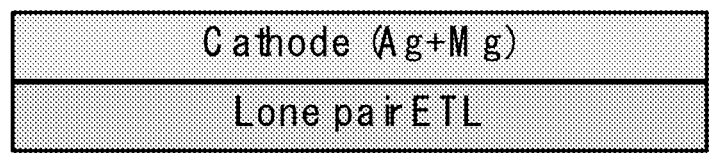
Figure 12C:
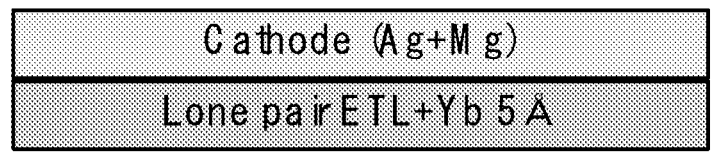
Figure 13A:
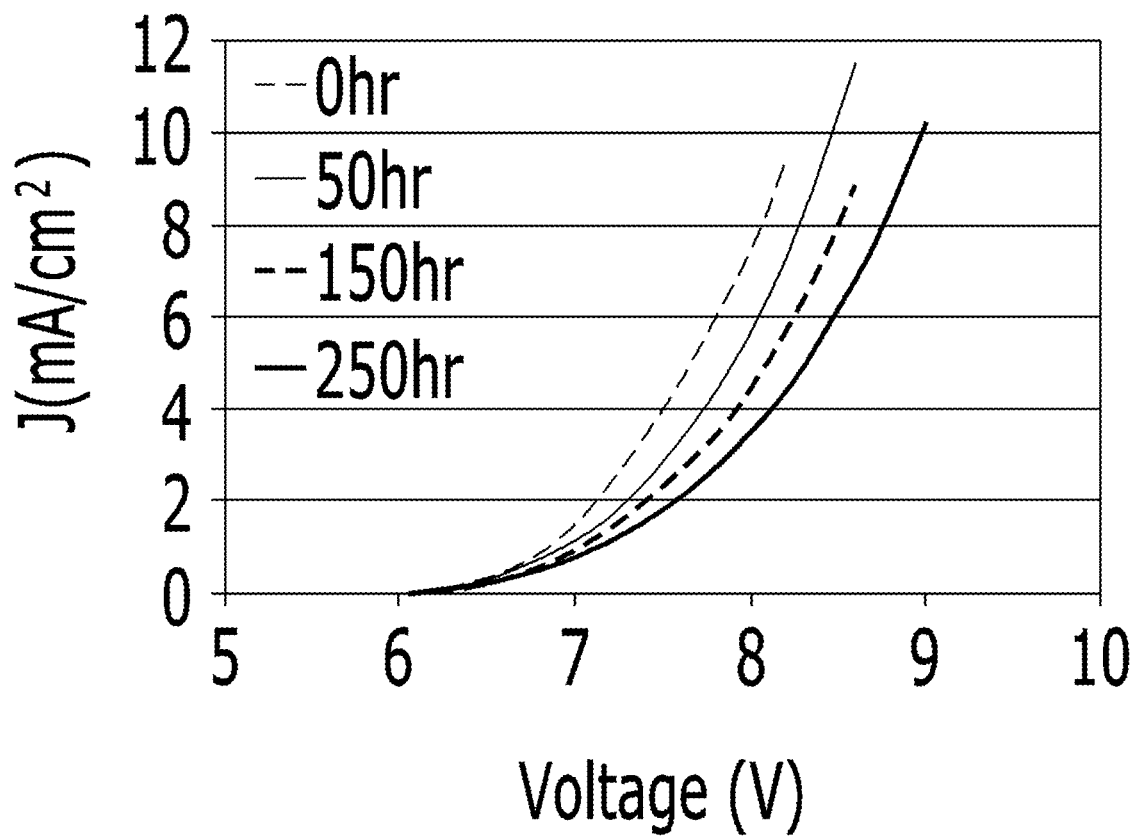
FIGS. 13A, 13B, and 13C are graphs representing voltage-current density characteristics of the respective stack structures of FIGS. 12A to 12C.
Figure 13B:
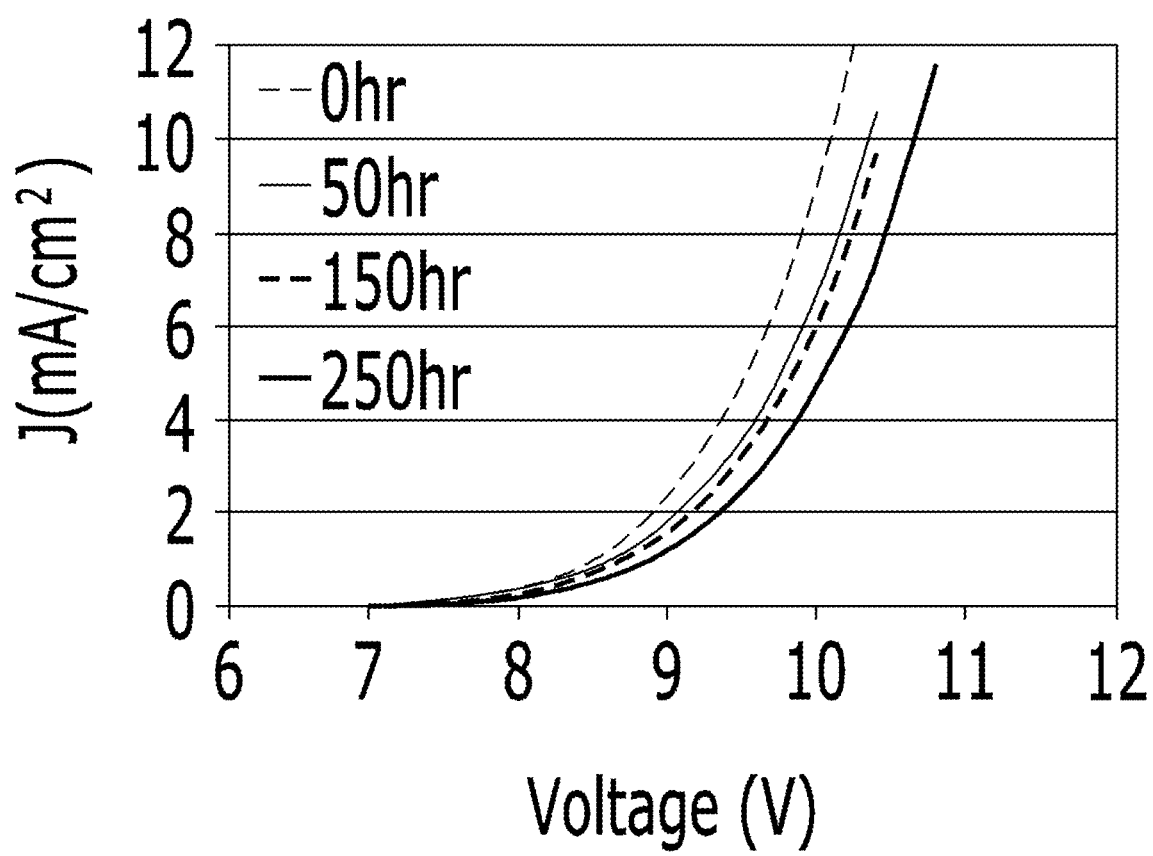
Figure 13C:
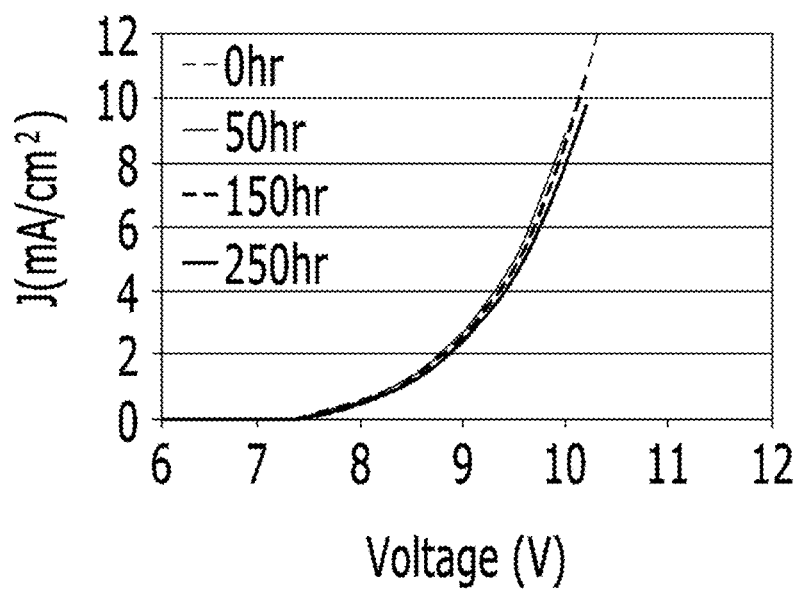

FIGS. 12A to 12C are cross-sectional views exemplarily illustrating various stack structures of an electron transport layer and an alloy cathode, which are applied to test 6. Further, FIGS. 13A to 13C are graphs representing voltage-current density characteristics of the respective stack structures of FIGS. 12A to 12C.

In the stack structures shown in FIGS. 12A to 12C, the cathodes were in common formed of an AgMg alloy film to have a thin thickness of 70 Å, and the electron transport layers formed under the cathodes had different compositions.

In the stack structure of FIG. 12A, the electron transport layer included an organic compound with no lone-pair electrons and ytterbium (Yb) which is a transition metal. Ytterbium (Yb) formed a layer having a thickness of 5 Å adjacent to the cathode. In this case, it may be confirmed from FIG. 13A that, when the stack structure was held at a current density of 5 mA/cm$^2$ for 250 hours, driving voltage had a variation of 0.65 V.

In the stack structure of FIG. 12B, the electron transport layer included an organic compound with lone-pair electrons (a first component) alone. In case of the stack structure of FIG. 12B, it may be confirmed from FIG. 13B that, when the stack structure was held at a current density of 5 mA/cm$^2$ for 250 hours, driving voltage had a variation of 0.52 V, and thus the stack structure of this case still had driving voltage variation although it is smaller than that of the stack structure of FIG. 12A.

In the stack structure of FIG. 12C, the electron transport layer was formed of a mixture of an organic compound with lone-pair electrons (a first component) and ytterbium (Yb) which is a transition metal (a second component). In this case, ytterbium (Yb) formed a layer having a thickness of 5 Å on the electron transport layer having a thickness of about 100 Å to 250 Å. In this case, it may be confirmed from FIG. 13C that, when the electron transport layer included the transition metal in addition to the first component with lone-pair electrons, no substantial current density difference was caused even if a high-temperature storage time was changed.

That is, bonding force between the dopant of the electron transport layer and the cathode at the interface therebetween may effectively prevent metal diffusion in the cathode at a high temperature, and thus the cathode formed of an AgMg alloy film having a thin thickness (of 100 Å or less, particularly 80 Å or less) may secure reliability in driving in a high-temperature environment.

Hereinafter, in addition to the embodiment of the present disclosure shown in FIGS. 1 to 4, stack structures of a cathode and layers contacting the cathode in accordance with various modified embodiments in accordance with the present disclosure will be described.

FIGS. 14A to 14H are cross-sectional views illustrating stack structures of a cathode and organic layers contacting the cathode in accordance with various embodiments of the present disclosure.

Figure 14A:
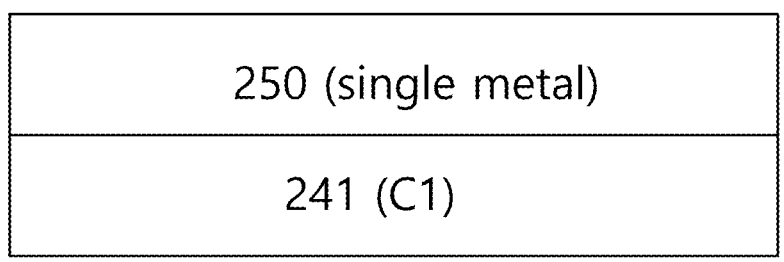

As exemplarily shown in FIG. 14A, in accordance with a second embodiment, an electron transport layer 241 is formed of a first component C1 including a single heterocyclic compound having atoms with lone-pair electrons, and a cathode 250 formed of a single transflective metal (Ag) is formed on the electron transport layer 241. Effects of this stack structure were described above with reference to FIG. 8A.

Figure 14B:
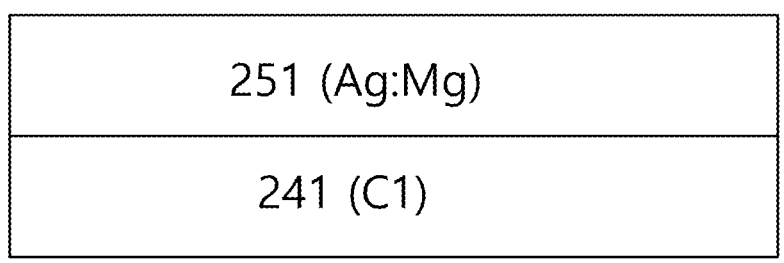

As exemplarily shown in FIG. 14B, in accordance with a third embodiment, an electron transport layer 241 is formed of a first component C1 including a single heterocyclic compound having atoms with lone-pair electrons, and a cathode 251 formed of a transflective metal alloy film (Ag:Mg) is formed on the electron transport layer 241. Effects of this stack structure were described above with reference to FIGS. 12B and 13B.

Figure 14C:
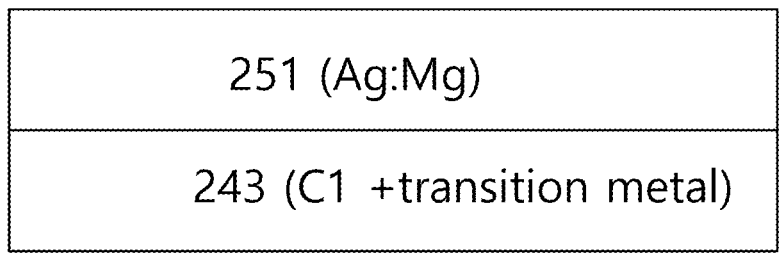

As exemplarily shown in FIG. 14C, in accordance with a fourth embodiment, an electron transport layer 243 is formed of a mixture of a first component C1 including a single heterocyclic compound having atoms with lone-pair electrons and a second component including a transition metal, and a cathode 251 formed of a transflective metal alloy film (Ag:Mg) is formed on the electron transport layer 243. Effects of this stack structure were described above with reference to FIGS. 12C and 13C.

Figure 14D:
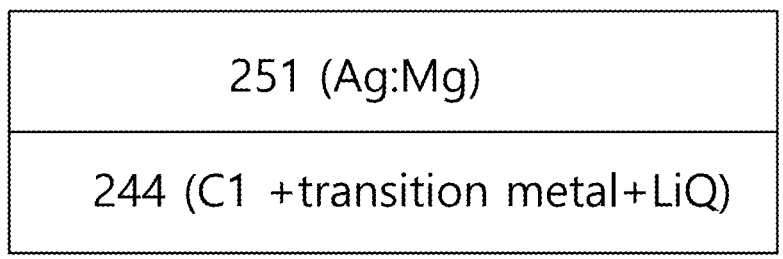

As exemplarily shown in FIG. 14D, in accordance with a fifth embodiment, an electron transport layer 244 is formed of a mixture of a first component including a single heterocyclic compound having atoms with lone-pair electrons, a second component including a transition metal and a third component including lithium quinoline (Liq), and a cathode 251 formed of a transflective metal alloy film (Ag:Mg) is formed on the electron transport layer 244. In this case, lithium atoms of lithium quinoline (Liq) may be bonded to the first component C1 by the above-described method, and thus stability of the electron transport layer 244 in accordance with this embodiment may be improved to be higher than stability of the electron transport layer 243 in accordance with the fourth embodiment.

Figure 14E:
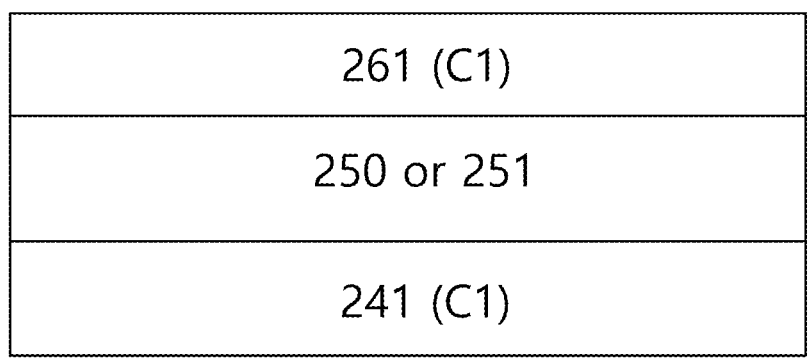

As exemplarily shown in FIG. 14E, in accordance with a sixth embodiment, an electron transport layer 241 is formed of a first component including a single heterocyclic compound having atoms with lone-pair electrons, a cathode 250 formed of a single transflective metal (Ag) or a cathode 251 formed of a transflective metal alloy film (Ag:Mg) is formed on the electron transport layer 241, and a first organic layer 261 formed of a same material as the first component C1 including the same single heterocyclic compound having atoms with lone-pair electrons as the electron transport layer 241 is formed on the cathode 250 or 251. Here, the electron transport layer 241 and the first organic layer 261 include the same material of the component, but the electron transport layer 241 and the first organic layer 261 have different functions, i.e., a function of transporting electrons and a function of extracting light or protecting the light emitting device, and may thus have different thicknesses.

As exemplarily shown in FIG. 14F, in accordance with a seventh embodiment, an electron transport layer 242 is formed of a mixture of a first component C1 including a single heterocyclic compound having atoms with lone-pair electrons and lithium quinoline (Liq), a cathode 250 formed of a single transflective metal (Ag) or a cathode 251 formed of a transflective metal alloy film (Ag:Mg) is formed on the electron transport layer 242, and a first organic layer 262 formed of the same mixture as the electron transport layer 242, i.e., a mixture of the same materials of a first component C1 including a single heterocyclic compound having atoms with lone-pair electrons and lithium quinoline (Liq), is formed on the cathode 250 or 251. Here, the electron transport layer 242 and the first organic layer 262 include the same materials of the component in the same manner as in the sixth embodiment, but the electron transport layer 242 and the first organic layer 262 have different functions, i.e., a function of transporting electrons and a function of extracting light or protecting the light emitting device, and may thus have different thicknesses.

As exemplarily shown in FIG. 14G, in accordance with an eighth embodiment, an electron transport layer 244 is formed of a triple mixture of a first component C1 including a single heterocyclic compound having atoms with lone-pair electrons, lithium quinoline (Liq) and a transition metal, a cathode 250 formed of a single transflective metal (Ag) or a cathode 251 formed of a transflective metal alloy film (Ag:Mg) is formed on the electron transport layer 244, and a first organic layer 263 formed of the same mixture as the electron transport layer 244, i.e., a triple mixture of the same materials as a first component including a single heterocyclic compound having atoms with lone-pair electrons, lithium quinoline (Liq) and a transition metal, is formed on the cathode 250 or 251. Here, the electron transport layer 244 and the first organic layer 263 include the same materials of the component in the same manner as in the sixth embodiment, but the electron transport layer 244 and the first organic layer 263 have different functions, i.e., a function of transporting electrons and a function of extracting light or protecting the light emitting device, and may thus have different thicknesses.

As exemplarily shown in FIG. 14H, in accordance with a ninth embodiment, an electron transport layer 244 is formed of a triple mixture of a first component C1 including a single heterocyclic compound having atoms with lone-pair electrons, lithium quinoline (Liq) and a transition metal, a cathode 250 formed of a single transflective metal (Ag) or a cathode 251 formed of a transflective metal alloy film (Ag:Mg) is formed on the electron transport layer 244, and a first organic layer 264 formed of a mixture of the same material of a heterocyclic compound having atoms with lone-pair electrons as the electron transport layer 244 and the same material of a transition metal as the electron transport layer 244 is formed on the cathode 250 or 251.

[Test 7]

Figure 15:
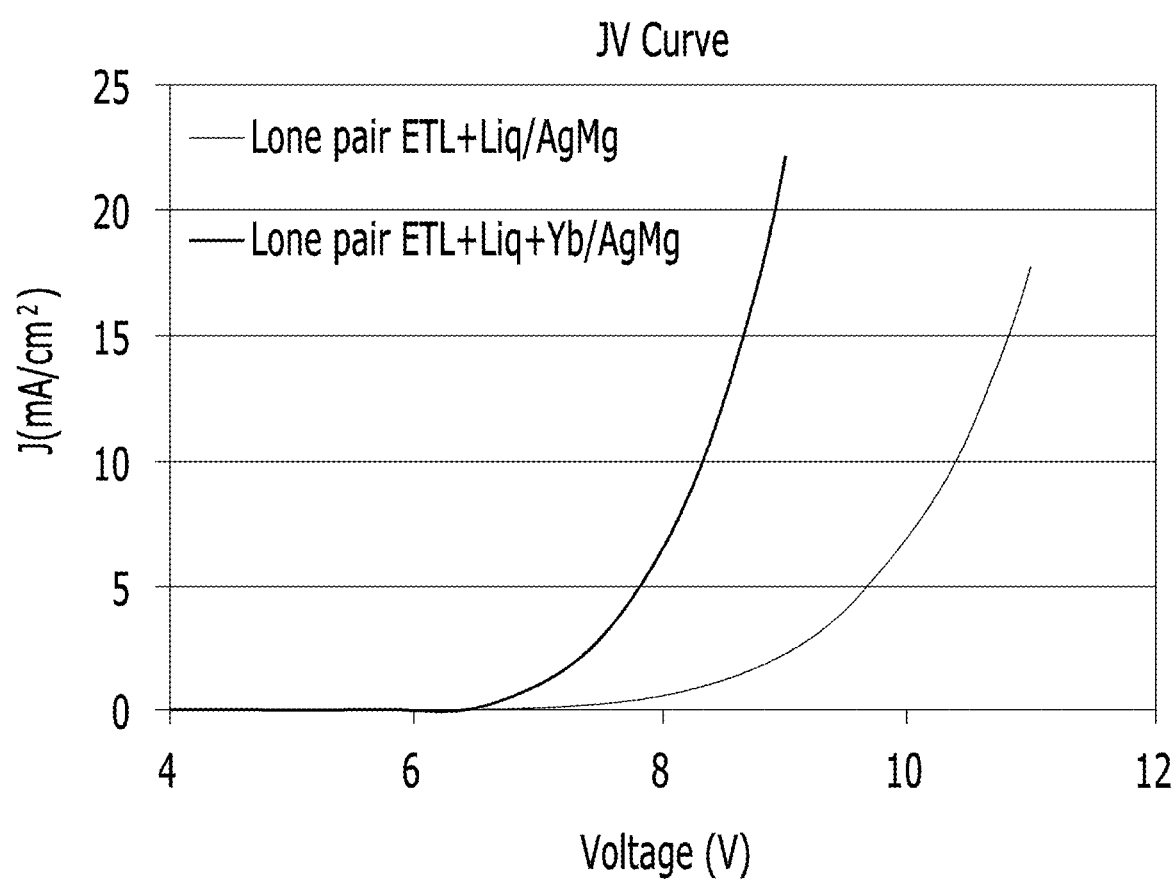
FIG. 15 is a graph representing voltage-current density characteristics of the stack structure of FIG. 14D and a stack structure having an electron transport layer formed of lithium quinoline and a first component.

FIG. 15 is a graph representing voltage-current density characteristics of the stack structure of FIG. 14D and a stack structure having an electron transport layer formed of lithium quinoline and a first component.

As exemplarily shown in FIG. 15, through comparison between the stack structure having the electron transport layer formed of lithium quinoline and the first component C1 and the stack structure in accordance with the fifth embodiment shown in FIG. 14D, it may be confirmed that the stack structure having the electron transport layer including the transition metal (C1+transition metal or C1+transition metal+Liq) (in the fourth embodiment or the fifth, eighth and ninth embodiments) uses low driving voltage at the same current density, and this means that the structure in which the electron transport layer further includes a transition metal in addition to the first component and lithium quinoline (Liq) is more effective in terms of reliability in driving the light emitting device than the structure in which the electron transport layer includes the first component and lithium quinoline (Liq).

In this test, the cathode formed of an AgMg alloy film was used in common, and the thickness of the cathode was 70 Å.

Figure 16:
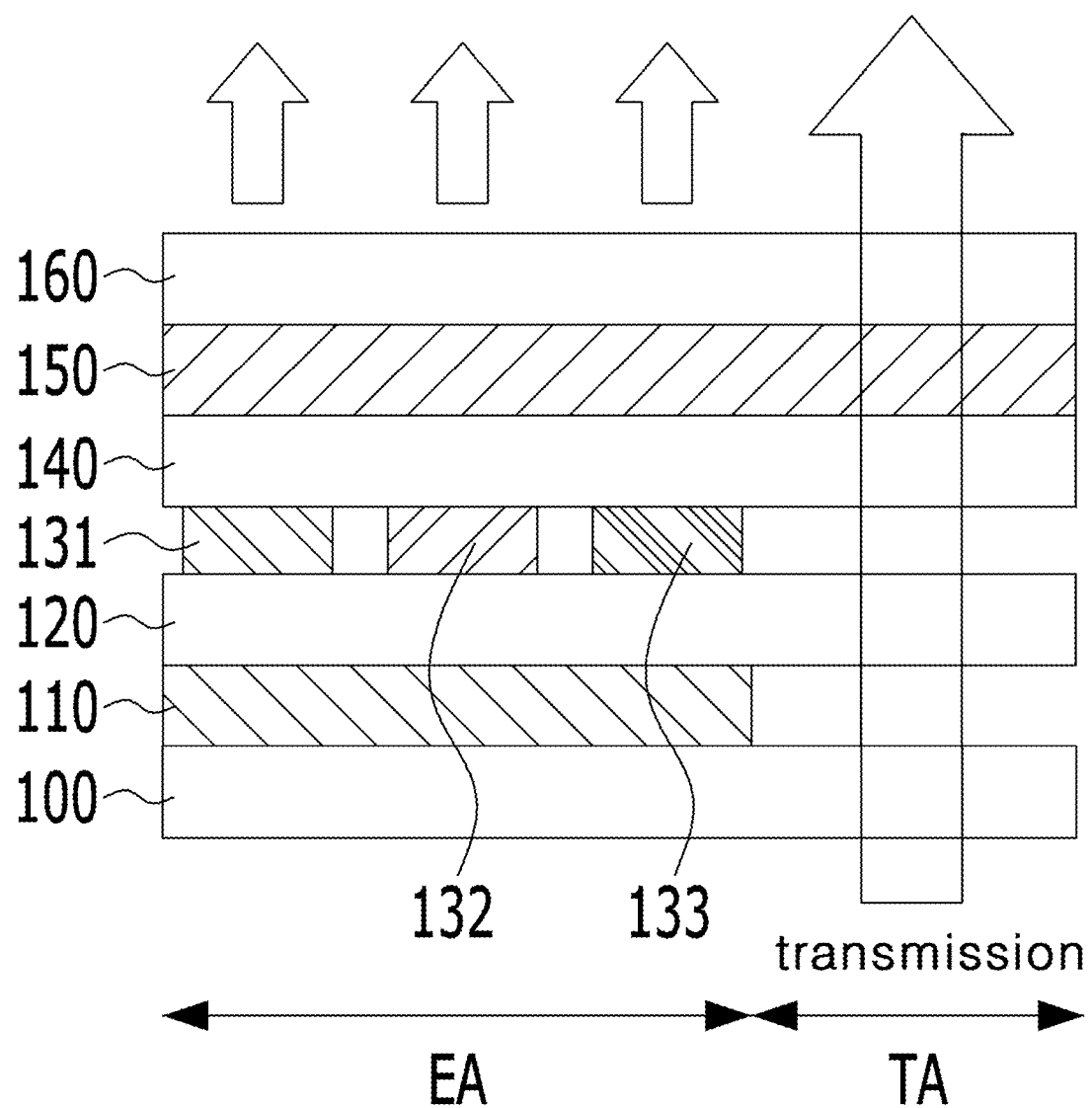
FIG. 16 is a cross-sectional view of a transparent display device in accordance with the present disclosure.

FIG. 16 is a cross-sectional view of a transparent display device in accordance with the present disclosure.

Hereinafter, a display device using the above-described light emitting device in accordance with the present disclosure will be described.

As exemplarily shown in FIG. 16, a transparent display device in accordance with one embodiment of the present disclosure includes a substrate 100 divided into a light emission area EA and a light transmission area TA, and a light emitting device on the substrate 100 and including a reflective anode 110 provided in the light emission area EA, light emitting layers 131, 132 and 133 provided on the reflective anode 110, a cathode 150 located above the light emitting layers 131, 132 and 133 and provided in the light emission area EA and the light transmission area TA, and an electron transport layer 140 located between the light emitting layers 131, 132 and 133 and the cathode 150 and including a component C1 (in FIGS. 1 to 4) having atoms with lone-pair electrons so that the atoms with lone-pair electrons are bonded to a metal component constituting the cathode 150.

Further, a first organic layer (or a capping layer) 160 is formed on the opposite surface of the cathode 150 on which the electron transport layer 140 including the first component C1 is not formed.

Between the electron transport layer 140 and the cathode 150, bonds between the atoms with lone-pair electrons in the electron transport layer 140 and the metal component constituting the cathode 150 may be horizontally continuously formed along the upper surface of the electron transport layer 140.

Further, between the first organic layer 160 and the cathode 150, bonds between the atoms with lone-pair electrons in the first organic layer 160 and the metal component constituting the cathode 150 may be formed along the upper surface of the cathode 150.

Further, at the interface between the cathode 150 and the electron transport layer 140, a bonding layer may be formed by horizontally continuous arrangement of the bonds between the atoms with lone-pair electrons and the metal component constituting the cathode 150, and particles of the metal component constituting the cathode 150 may be arranged as a layered structure on the bonding layer. For example, the layered structure may comprise a plurality of layers of the particles of the metal component constituting the cathode 150.

Further, the transparent display device further includes a second organic layer 120 provided between the reflective anode 110 and the light emitting layers 131, 132 and 133. Further, the second organic layer 120 may be provided in the light emission area EA and the transmission area TA.

The light emitting layers 131, 132 and 133 located in the light emission area EA may include first to third light emitting layers 131, 132 and 133 to emit light of different colors. Except for the first to third light emitting layers 131, 132 and 133 and the anode 110, each of the respective organic layers 120 and 160 and the cathode 150, may be formed as an integral type in the light emission area EA and the light transmission area TA, and the respective organic layers 120 and 160 are formed in common in all the areas and thus be referred as common organic layers.

Although not shown in the drawings, the transparent display device may further include a thin film transistor connected to the reflective anode 110 so as to drive each light emission area EA, on the substrate 100.

Non-described effects of the elements refer to the above-described principle and effects of the light emitting device.

The light emitting device and the transparent display device using the same in accordance with the present disclosure improve bonding force between the electron transport layer and the cathode, and thus transmittance of the transparent display device having both a light emission area and a light transmission area in which the cathode may be implemented as a thin film may be secured. Further, electrical bonding force between the electron transport layer and the cathode is high, and thus electric resistance may be lowered even if the cathode having a small thickness is used.

Further, the atoms with lone-pair electrons in the electron transport layer hold the metal component of the cathode, and may prevent metal diffusion of the cathode and secure high-temperature stability due to band alignment.

The light emitting device in accordance with the present disclosure may be applied, for example, not only to an organic light emitting device using an organic light emitting layer as a light emitting layer but also to an inorganic light emitting device including quantum dots as a light emitting layer. The light emitting device in accordance with the present disclosure may be applied, for example, to any structure which has the interface between an electron transport layer and a cathode, in addition to the above-described organic or inorganic light emitting device, and thereby have both high-temperature stability and increase in lifespan.

As apparent from the above description, a light emitting device and a transparent display device using the same in accordance with the present disclosure have effects as follows.

First, the light emitting device in accordance with the present disclosure includes an electron transport layer including a compound with lone-pair electrons as a main component and contacting a cathode so that the lone-pair electrons are bonded to a metal component constituting the cathode at the interface between the cathode and the electron transport layer, and may thus achieve interfacial stabilization and reduce or eliminate aggregation of metal particles in the cathode.

Second, bonding force between not only the lone-pair electrons in the electron transport layer but also a component included in the electron transport layer as a dopant and the metal component constituting the cathode occurs at the interface between the cathode and the electron transport layer, and thus prevent degradation or change of the cathode even in a high-temperature environment and secure reliability of the light emitting device at a high temperature.

Third, the metal component constituting the cathode and the component of the electron transport layer are bonded, and thus reliability of a designated degree or more may be acquired even if the cathode is formed of a single metal.

Fourth, the light emitting device includes an organic layer, including a compound with lone-pair electrons as a main component, as a capping layer on the upper surface of the cathode, in addition to the electron transport layer provided on the lower surface of the cathode, and may thus improve bonding force between the cathode and the organic layers contacting both surfaces of the cathode and preventing change in the entirety of the cathode in a high-temperature environment.

Fifth, a film between the lone-pair electrons and the metal component constituting the cathode is horizontally formed on the surface of the cathode, particles of the metal component are arranged along such a horizontal bonding film, and the cathode is formed as a uniform film having a layered structure and may thus be formed to have a small thickness of 100 Å or less. Therefore, when the transparent display device including the cathode is implemented, transmittance of the transparent display device may be improved.

It will be apparent to those skilled in the art that various modifications and variations can be made in the present disclosure without departing from the spirit or scope of the present disclosure. Thus, it is intended that the present disclosure cover the modifications and variations of this present disclosure provided they come within the scope of the appended claims and their equivalents.

What is claimed is:

1. A transparent display device comprising:
   a substrate including a light emission area that emits light and a light transmission area that transmits light; and
   a light emitting device on the substrate, the light emitting device including:
   an anode;
   a light emitting layer on the anode at the light emission area;
   an electron transport layer at the light emission area and the transmission area, the electron transport layer comprises a first component comprising a heterocyclic compound having atoms with lone-pair electrons and a second component comprising at least one of an electron-injecting metal or an electron-injecting metal compound, a volume of the second component being less than a volume of the first component in the electron transport layer;
   a cathode on the electron transport layer and disposed at both of the light emitting area and the light transmission area, the cathode comprising a metal component; and
   a first organic layer comprising a third component as a same material as the first component and a transition metal, the first organic layer over a first surface of the cathode,
   wherein the first surface of the cathode is opposite to a second surface of the cathode and the electron transport layer is directly in contact with the second surface of the cathode, and
   wherein at least one of the atoms with the lone-pair electrons of the first component is bonded to the metal component constituting the cathode,
   wherein the cathode is in contact with the first organic layer including the first component and the transition metal at the transmission area and the light emission area.

2. The transparent display device according to claim 1, further comprising a second organic layer provided between the anode and the light emitting layer,
   wherein the second organic layer is provided throughout the light emission area and the light transmission area.

3. The transparent display device according to claim 2, wherein the first organic layer is in contact with the first surface of the cathode.

4. The transparent display device according to claim 3, wherein an upper surface of the electron transport layer includes further bonds between the second component in the electron transport layer and the metal component constituting the cathode.

5. The transparent display device according to claim 3, wherein the first surface of the cathode, between the first organic layer and the cathode, includes bonds between the atoms with lone-pair electrons in the first organic layer and the metal component constituting the cathode.

6. The transparent display device according to claim 1, wherein the metal component of the cathode comprises one of a transflective metal or a transflective metal alloy.

7. The transparent display device according to claim 6, wherein the metal component of the cathode further comprises a transition metal.

8. The transparent display device according to claim 1, wherein the electron-injecting metal is one selected from a transition metal, an alkali metal, and an alkali earth metal.

9. The transparent display device according to claim 1, wherein the electron transport layer further comprises lithium quinoline.

10. The transparent display device according to claim 1, wherein the first organic layer further comprises lithium quinoline.

11. The transparent display device according to claim 6, wherein the cathode has a thickness of 100 Å or less.

12. The transparent display device according to claim 1, wherein an interface between the cathode and the electron transport layer includes a bonding unit having horizontally continuous arrangement of bonds between the atoms with lone-pair electrons and the metal component constituting the cathode, and particles of the metal component constituting the cathode are arranged on the bonding unit, wherein the particles of the metal component constituting the cathode are arranged without aggregation in the cathode.

13. The transparent display device according to claim 1, wherein the first component of the electron transport layer comprises at least one selected from a Chemical formula 1, a Chemical formula 2 and a Chemical formula 3,

[Chemical formula 1]

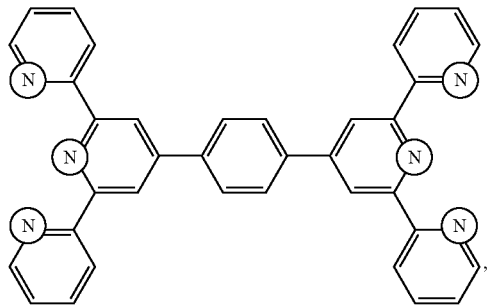

[Chemical formula 2]

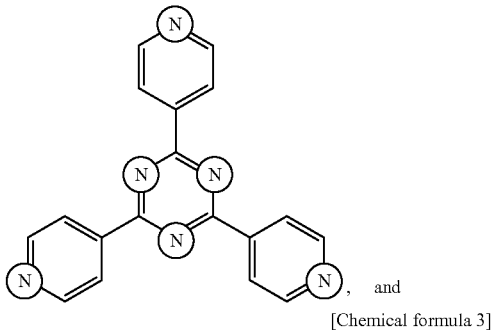, and

[Chemical formula 3]

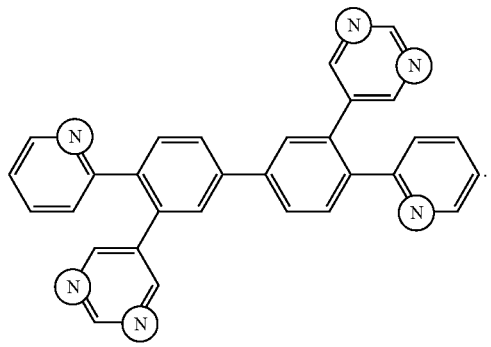.

* * * * *